(12) United States Patent
van Mol et al.

(10) Patent No.: US 8,772,776 B2
(45) Date of Patent: Jul. 8, 2014

(54) ELECTRO-OPTIC DEVICE AND METHOD FOR MANUFACTURING THE SAME

(75) Inventors: Antonius Maria Bernardus van Mol, Eindhoven (NL); Joanne Sarah Wilson, Dordrecht (NL); Chia-Chen Fan, The Hague (NL); Herbert Lifka, Son en Breugel (NL); Erik Dekempeneer, Malle (BE); Edward Willem Albert Young, Maastricht (NL)

(73) Assignees: Nederlandse Organisatie voor toegepast-natuurwetenschappelijk onderzoek TNO, Delft (NL); Koninklijke Philips Electronics N.V., Eindhoven (NL)

( * ) Notice: Subject to any disclaimer, the term of this patent is extended or adjusted under 35 U.S.C. 154(b) by 313 days.

(21) Appl. No.: 13/142,595

(22) PCT Filed: Dec. 29, 2009

(86) PCT No.: PCT/NL2009/050811
§ 371 (c)(1),
(2), (4) Date: Oct. 11, 2011

(87) PCT Pub. No.: WO2010/077139
PCT Pub. Date: Jul. 8, 2010

(65) Prior Publication Data
US 2012/0025259 A1 Feb. 2, 2012

(30) Foreign Application Priority Data

Dec. 29, 2008 (EP) .................................. 08173040

(51) Int. Cl.
*H01L 29/04* (2006.01)

(52) U.S. Cl.
USPC ........................................................ 257/59

(58) Field of Classification Search
CPC .................................................. H01L 27/3241
USPC ....................... 438/55, 60, 99; 257/59, 72, 99
See application file for complete search history.

(56) References Cited

U.S. PATENT DOCUMENTS

| 6,951,770 | B2 | 10/2005 | Middelman et al. |
| 7,098,085 | B2 * | 8/2006 | Yamanaka et al. ............ 438/149 |
| 7,202,600 | B2 | 4/2007 | Zovko et al. |
| 7,749,794 | B2 | 7/2010 | Gaudiana et al. |
| 2001/0015620 | A1 | 8/2001 | Affinito |

(Continued)

FOREIGN PATENT DOCUMENTS

| DE | 10 2007 056 924 A1 | 3/2009 |
| JP | 10-41682 A | 2/1998 |

(Continued)

OTHER PUBLICATIONS

English Translation of Japanese Office Action dated Jul. 30, 2013, issued in corresponding Japanese Application No. 2011-543456.

*Primary Examiner* — Brook Kebede
(74) *Attorney, Agent, or Firm* — Novak Druce Connolly Bove + Quigg LLP

(57) ABSTRACT

An electro-optic device may include a substrate that supports a first and a second electrode, a functional structure including at least one functional layer that is electrically coupled to the electrodes, and an etched metal structure electrically coupled to at least one of the electrodes.

15 Claims, 8 Drawing Sheets

(56) References Cited

U.S. PATENT DOCUMENTS

| | | |
|---|---|---|
| 2002/0011783 A1 | 1/2002 | Hosokawa |
| 2003/0160243 A1 | 8/2003 | Middelman et al. |
| 2005/0224935 A1 | 10/2005 | Schaepkens et al. |
| 2007/0077349 A1 | 4/2007 | Newman et al. |
| 2007/0273276 A1 | 11/2007 | Ottermann et al. |
| 2009/0101206 A1 | 4/2009 | Diklich |

FOREIGN PATENT DOCUMENTS

| | | | |
|---|---|---|---|
| JP | 2003017253 A | * | 1/2003 |
| JP | 2005-142446 A | | 6/2005 |
| JP | 2006-526263 A | | 11/2006 |
| JP | 2007-526615 A | | 9/2007 |
| JP | 2008-544555 A | | 12/2008 |
| JP | 2009-510696 A | | 3/2009 |
| WO | 02/21595 A2 | | 3/2002 |
| WO | 03/094256 A2 | | 11/2003 |
| WO | 2004/107467 A2 | | 12/2004 |
| WO | 2005/096405 A1 | | 10/2005 |
| WO | 2007/002376 A2 | | 1/2007 |
| WO | 2007/036850 A2 | | 4/2007 |
| WO | 2007/041116 A1 | | 4/2007 |
| WO | 2008/001756 A1 | | 1/2008 |
| WO | 2008/090493 A1 | | 7/2008 |

* cited by examiner

S1

S2

S4

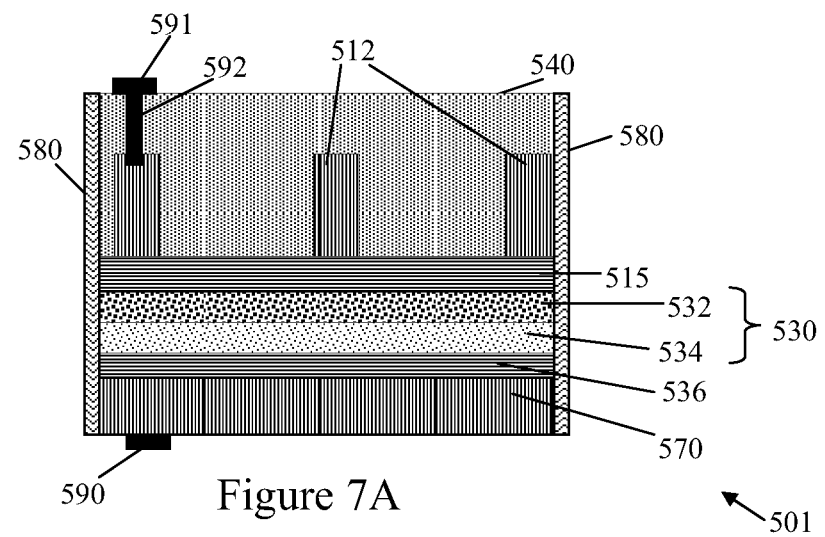
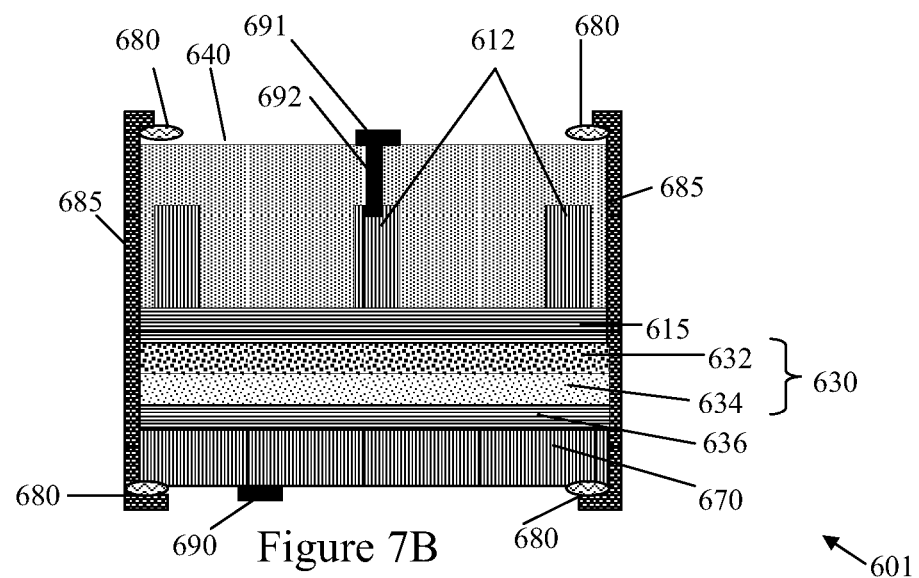

US 8,772,776 B2

ELECTRO-OPTIC DEVICE AND METHOD FOR MANUFACTURING THE SAME

CROSS-REFERENCE TO RELATED APPLICATIONS

This application is filed under 35 U.S.C. 371 as a U.S. national phase application of PCT/NL2009/050811, having an international filing date of 29 Dec. 2009, which claims the benefit of European Patent Application No. 08173040.0, having a filing date of 29 Dec. 2008, both of which are hereby incorporated by reference.

BACKGROUND OF THE INVENTION

1. Field of the Invention

The present invention relates to an electro-optic device. The present invention further relates to a method for manufacturing an electro-optic device.

2. Related Art

An electro-optic device is a device that provides for an optical effect in response to an electric signal, or that generates an electric signal in response to an optical stimulus. Examples of the first are light emitting diodes, such as organic light emitting diodes and electro chromic devices. Examples of the second are photo voltaic cells.

For large area OLED lighting on flexible plastic substrates, a large current is required to drive the system. The present thin film materials used for the anode (e.g. ITO) and cathode (e.g. Ba/Al) have a large resistivity and the large currents give rise to substantial voltage drop, which determine inhomogeneous light emission. For producing large area flexible OLED devices on plastic substrates there is a need for additional metallization structure of the plastic substrate. For reducing the manufacturing costs, such structured metallization coatings will preferably be applied on rolls of plastic foil using an inline roll-to-roll web coating process.

Accordingly, for electro-optic devices, such as light emitting devices and electro-chromic devices, but also for photovoltaic products there is a need for a metallization structure that on the one hand has a good electrical conductivity, while on the other hand has a high transmission for radiation.

WO2007/036850 describes an organic diode device that comprises an organic diode structure having an anode layer, a cathode layer and an organic layer. One of the anode layer and the cathode layer has a set of contact areas that are distributed over a face of said structure. A barrier layer hermetically covers said structure and is provided with a set of openings aligned with said set of contact areas. A metal conductor has been electroplated on said barrier layer and contacts the set of contact areas via the set of openings.

The electroplated metal conductor shunts the anode and the cathode, and therewith provides for an even voltage distribution over the area of a large organic diode device and therewith an even luminance.

SUMMARY

It is an object of the present invention to provide an improved electro-optic device.

It is a further object of the present invention to provide an improved method for manufacturing an electro-optic device.

According to a first aspect an electro-optic device is provided comprising
 a substrate that supports
  a first and a second electrode,
  a functional structure comprising at least one functional layer, that is electrically coupled to the electrodes,
  an etched metal structure being electrically coupled to at least one of the electrodes.

According to an second aspect there is provided a method of manufacturing an electro-optic device comprising the subsequent steps of
 providing a first, metal substrate,
 providing a second substrate,
 selectively etch the metal substrate to form an etched metal structure,
 deposit a functional structure.

The wording "subsequent" is understood to mean that the identified steps are performed in the order in which they are mentioned above. However, one or more additional steps may be performed between performance of two subsequent steps.

The etched metal structure serves as a shunt for the at least one of the electrodes. In this way in case of a light emitting device, a homogeneous voltage distribution is realized. Before it is selectively etched, the metal substrate serves as a carrier that enables deposition of various layers of the electro-optic device. The metal substrate allows for high temperature processing, which makes it possible to select from a larger arsenal of processing technologies those processing technologies which are most favorable in terms of processing speed and quality.

By selectively etching the metal substrate auxiliary conductive structures can be formed that can be used to shunt the cathode and/or anode of the device. As the metal structure is etched, it is relatively easily to form a pattern having elements with a relatively high aspect ratio between their height and the width. The etched metal structure may for example have a pattern of conducting lines with such a relatively high aspect ratio. Accordingly the etched metal structure can have a high conductivity, while on the other hand it is substantially invisible.

It can be recognized from the grain structure of the remaining metal in the metal structure that it is the remainder of a substantially continuous layer. Metals foils have this grain structure as they are rolled from metal grains. Furthermore it can be seen that the remaining metal structure has morphology features that are characteristic for the type of etching used, that could not have resulted from deposition methods.

It is noted that WO2007/002376 describes a method for manufacturing a photovoltaic cell. The method comprises contacting a die with a first layer, the first layer supporting a metal layer, so that at least a portion of the metal layer is transferred to a second layer to form a photovoltaic cell electrode in the form of a mesh with a plurality of open regions.

According to WO2007/002376 a mesh electrode can be stamped on a layer by the following method. A die (e.g., a hot stamping die) having a pattern (e.g., a mesh pattern) machined into its surface can be brought into contact with the back surface of a first layer (e.g., a flexible substrate). The front surface of the first layer can be coated with a continuous metal layer. The front surface of the first layer can then be brought into contact with a second layer, which serves as a receiving layer. When a pressure is applied to the die, the metal layer on the front surface of the first layer transfers and adheres to the second layer. The pressure applied to the die can be at least about 100 psi (e.g., at least about 1,000 psi or at least about 5,000 psi). In some embodiments, the front surface of the first layer can be brought into contact with the second layer before the die contacts the back surface of the first layer.

According to another method the mesh can be prepared by chemical etching. WO2007/002376 however does not disclose that the step of etching the metal substrate follows the step of providing a second substrate. By first providing the second substrate before the step of etching takes place the first metal substrate can serve as a carrier on which various layers of the electro-optic device can be deposited during the manufacturing process, such as the second substrate and a layer of transparent, electrically conductive oxide.

In an embodiment of the electro-optic device at least one of the electrodes is formed as a layer, wherein a surface of the etched metal structure directly contacts the layer. In this embodiment a very reliable electrical contact is realized between said at least one of the electrodes and the etched metal structure.

In another embodiment of the electro-optic device the etched metal structure is electrically coupled to the at least one of the electrodes in that a portion of the etched metal structure forms the at least one of the electrodes. Also in this embodiment a very reliable electrical contact is realized as the electrode forms a unity with the etched metal structure.

In an embodiment of the method the step of selectively etching the metal substrate is preceded with a step of homogeneously reducing a thickness of the metal substrate. In the initial stage of processing the metal substrate serves to support the structures formed thereon. Once the (temporary) second substrate is applied, the metal substrate has no supporting function anymore. The thickness for the auxiliary conductive structures can be substantially smaller. Accordingly in this step of homogeneously reducing, the thickness of the metal substrate can be reduced to the thickness of the conductive structure to be formed.

In another embodiment of the method the step of selectively etching the metal substrate is succeeded with a step of homogeneously reducing a thickness of the metal substrate. In this way an etched metal structure having a different pattern is obtained. In general terms the contours of the etched metal structure are now more rounded off. This facilitates processing if a conformal deposition of a further layer on the etched metal structure is desired as a further processing step.

Such step of homogeneous reducing the metal substrate preferably results in a reduction of a thickness of the layer with at least a factor 2. In practice the metal substrate may have a thickness of e.g. 50-200 μm, while the conductive structure for example has a thickness in the range of 1-50 μm.

In an embodiment of the method the functional structure is deposited blanketwise over the etched metal structure. This way of deposition of the functional structure can be realized for example with printing and slot-die technologies, which is attractive. A blanket wise deposition of the functional structure is possible after a relatively strong etching of the metal substrate, as in that case the resulting etched metal structure have smoothly curved details. This is for example the case if a step of homogeneously reducing a thickness of the metal substrate follows the step of selective etching.

In an embodiment of a method according to the invention, the second substrate is removed after the etched metal structure is embedded into a third substrate, and wherein the functional structure is applied at the place of the second substrate. It is an advantage of this embodiment that regardless the thickness of the electrically conductive structure, the functional layers can be applied blanket wise.

In this embodiment the second substrate is for example temporarily attached by a temporary adhesive. The temporary adhesive may be a weak adhesive which on the one hand provides for a sufficient support during a first stage of the manufacturing process wherein the metal layer is processed and embedded in the third substrate, while the adhesive on the other hand is sufficiently weak to allow it to be peeled off from the stack with the third substrate.

The method according to the present invention results in an electro-optic device comprising
a substrate that supports
a first and a second electrode,
a functional structure comprising at least one functional layer, that is electrically coupled to the electrodes,
an etched metal structure being electrically coupled to at least one of the electrodes.

In a particular embodiment of the electro-optic device at least one of the electrodes is formed as a layer, wherein a surface of the etched metal structure directly contacts the layer. In this embodiment a very reliable electrical contact is realized between said at least one of the electrodes and the etched metal structure. In this case the contact surface between the electrode and the etched metal structure is proportional to the product of the width and the length of the ribs. In practice the ribs may have a width in the order of 10 to 100 μm.

An electrode deposited in openings formed by the etched metal structure, i.e. between the ribs, as disclosed in WO2007/002376, the contact surface is only proportional to the product of the height of the electrode and the length of the ribs. In case said electrode is a transparent electrically conductive electrode, its height should be limited to for example 100 nm to 1 μm.

Accordingly, as in the particular embodiment of the present invention the transparent electrically conductive electrode is applied as a layer at the surface of the etched metal structure and not in openings thereof, a substantially better electrical contact is obtained between the transparent electrically conductive electrode and the etched metal structure.

In another embodiment of the electro-optic device the etched metal structure is electrically coupled to the at least one of the electrodes in that a portion of the etched metal structure forms the at least one of the electrodes. Also in this embodiment a very reliable electrical contact is realized as the electrode forms a unity with the etched metal structure.

BRIEF DESCRIPTION OF THE DRAWINGS

These and other aspects are described in more detail with reference to the drawing. Therein:

FIG. 2I shows a device according to the present invention obtained with the method, FIG. 5B illustrates a device obtained with the further alternative method, FIG. 6E illustrates a device obtained with the further alternative method, FIG. 7A illustrates a further embodiment of a device according to the invention, FIG. 7B illustrates a further embodiment of a device according to the invention.

DETAILED DESCRIPTION OF EMBODIMENTS

Figures 1A, 1B:
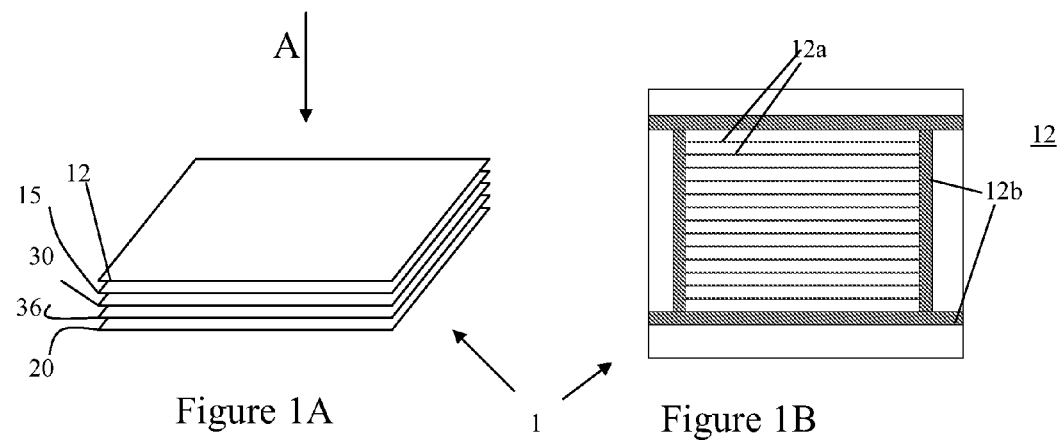
FIG. 1A schematically shows an electro-optic device.
FIG. 1B-1F shows in top-view an etched metal structure of various embodiments of a device according to the invention.

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. It will further be understood that when a particular step of a method is referred to as subsequent to another step, it can directly follow said other step or one or more intermediate steps may be carried out before carrying out the particular step. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures.

It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. All publications, patent applications, patents, and other references mentioned herein are incorporated by reference in their entirety. In case of conflict, the present specification, including definitions, will control. In addition, the materials, methods, and examples are illustrative only and not intended to be limiting.

FIG. 1A schematically shows an electro-optic device 1. The device comprises a substrate 20 that supports a first and a second electrode 15, 36, and a functional structure 30 comprising at least one functional layer 32, 34, that is electrically coupled to the electrodes. Although in practice a larger plurality of functional layers is used, e.g. 10 for simplicity it is presumed that the plurality is 2. The device further comprises an etched metal structure 12 that is electrically coupled to at least one of the electrodes 15.

FIG. 1B shows an example of an etched metal structure in a top-view of the device of FIG. 1A according to A. Likewise FIGS. 1C to 1F shows various alternative topologies. For clarity in these Figures only the electrically conductive structure formed by the etched metal structure is shown.

The etched metal structure 12 of FIG. 1B comprises relatively narrow metal shunting lines 12a and relatively wide metal busbars 12b. The shunting lines for example have a width in the range of 10 to 100 μm, e.g. 50 μm and serve as a shunt for at least one of the electrodes, here the anode 15. The busbars 12b have a width in the range of 1 to 5 mm, for example 1 mm to facilitate an electrical contact with the device 1.

FIGS. 1C to 1F shows various other topologies for the etched metal structure 12.

Figures 1C, 1D:
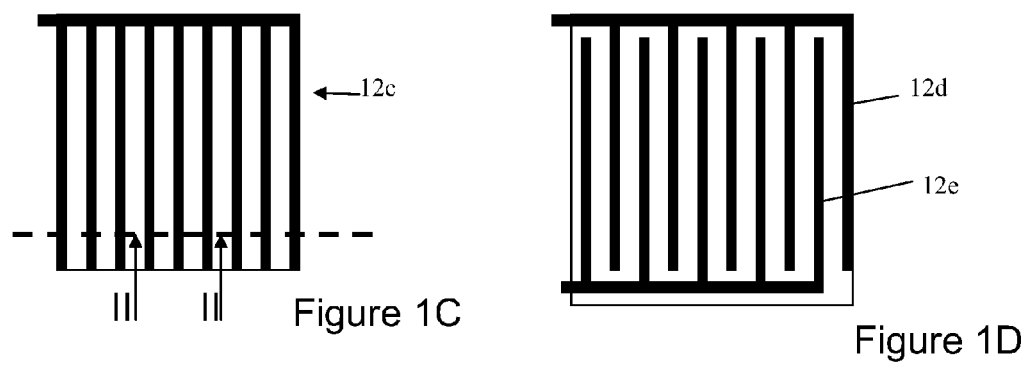

In FIG. 1C, the at least one electrically conductive structure 12c is a comb structure.

In FIG. 1D a pair of electrically conductive structures 12d, 12e, each in the form of a comb structure, and gripping into each other is shown.

Figures 1E, 1F:
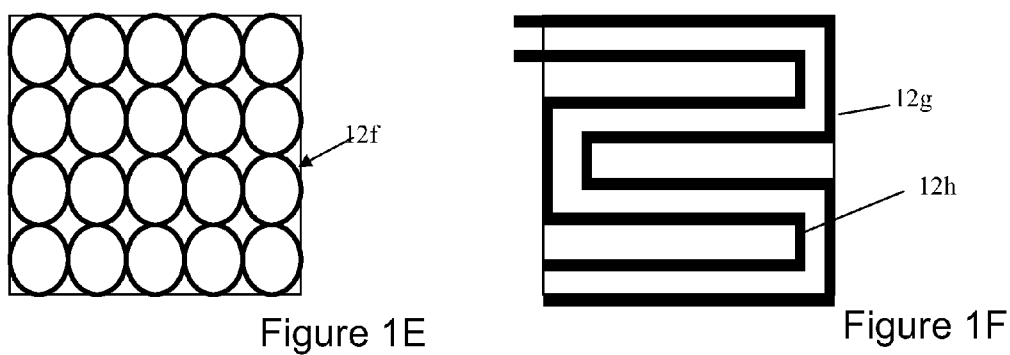

FIG. 1E shows another example of a maze-like electrically conductive structure 12f. Also other structures are possible e.g. in the form of a honeycomb.

FIG. 1F shows an example wherein a plurality of meandering electrically conductive structures 12g, 12h is arranged. In the example a pair of conductors is shown that may for example each carry a polarity of power sources.

However, additional electrically conductive structures may be present, for example to carry control signals.

The present invention will now be described in more detail with reference to the embodiment of FIG. 1C.

Figure 2A:
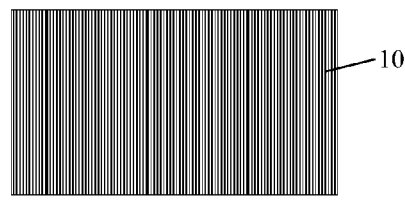
FIG. 2A-2I shows steps of an embodiment of a method according to the present invention, therein
Figure 2B:
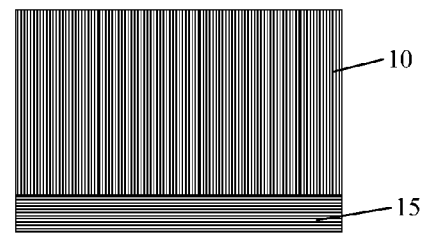
Figure 2C:
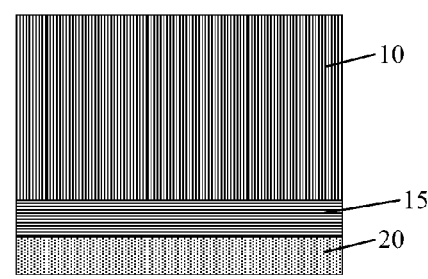
Figure 2D:
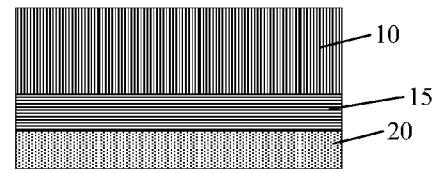
Figure 2E:
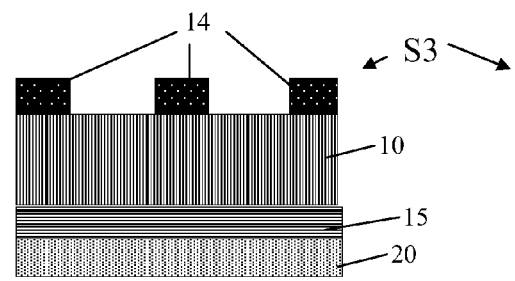
Figure 2F:
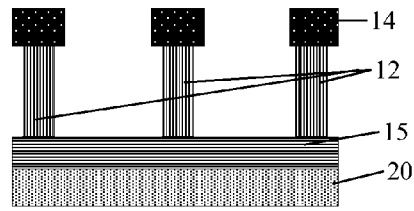
Figure 2G:
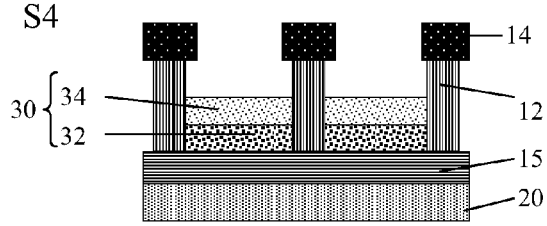
Figure 2H:
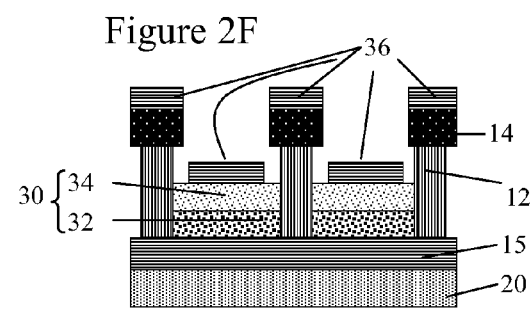
Figures 2I, 2J:
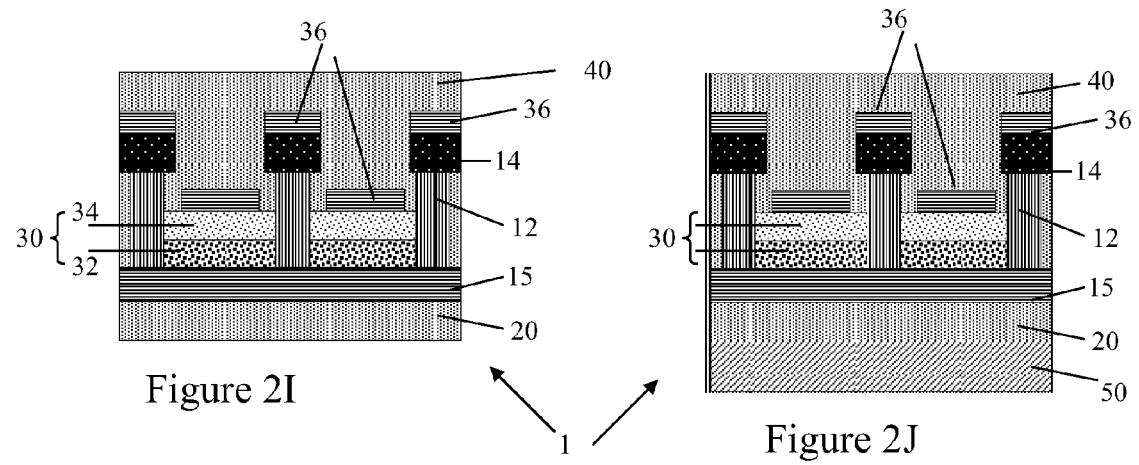
FIG. 2J shows an alternative device according to the invention obtained with an alternative method.

FIG. 2I shows a first exemplary embodiment of an electro-optic device according to the present invention. The device is shown in a cross-section according to II-II in FIG. 1C. In the embodiment shown, the device 1 is an organic light emitting diode. The device comprises a functional structure 30 that is embedded between an anode layer 15, and a cathode layer 36. Various materials may be used having the purpose of emitting radiation. The functional structure may typically comprise any organic electroluminescent ("EL") material, including, but not limited to, small molecule organic fluorescent compounds, fluorescent and phosphorescent metal complexes, conjugated polymers, and combinations or mixtures thereof.

Examples of fluorescent compounds include, but are not limited to, pyrene, perylene, rubrene, dcm, coumarin, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly (p-phenylenes), copolymers thereof, and may further include combinations or mixtures thereof.

The choice of a particular material may depend on the specific application, potentials used during operation, or other factors. In the embodiment shown the functional structure 30 comprises a first layer 32 of PEDOT having a thickness of approximately 70 nm, and a second layer 34 of a light emitting polymer LEP from one of the materials selected as described above, having a thickness of 50 to 100 nm, here 80 nm.

The anode layer 15 is formed by SnO2:F. Instead of this material also other transparent conductive materials may be used, e.g. a transparent conductive oxide like cadmium oxide, tin oxide, indium tin oxide, zinc oxide, zinc oxide doped with aluminium, fluorine, gallium or boron. The cathode layer 36 is formed by a dual layer of Ba/Al, comprising a first layer of barium having a thickness of 5 nm in contact with the LEP layer 34 and a second layer of Al having a thickness of 100 nm upon the Ba layer. Other suitable materials are for example LiF or Ag.

The etched metal structure 12, here an aluminium structure, comprises ribs having a height of 1 to 50 µm and a width of 10 to 100 µm. In a typical example the ribs have a height of 10 µm and a width of 50 µm. Other suitable metals are for example chromium, copper, nickel, molybdenum, silver, zinc. Also alloys are possible. In practice a material like cupper or aluminium will be most suitable for cost reasons. The transparent conductive electrode 15 is attached directly to the ribs of the etched metal structure 12.

The etched metal structure 12 is embedded in a barrier structure 40. Suitable barrier structures are formed by a stack of alternating organic and inorganic layers comprising at least one organic layer sandwiched between a first and a second inorganic layer. The organic layers may comprise cross-linked (thermoset) material, an elastomer, a linear polymer, or a branched or hyper-branched polymer system or any combination of the aforementioned, optionally filled with inorganic particles of small enough size to still guarantee light transmission.

The material of the organic layer preferably has a low specific water vapour transmission rate and a high hydrophobicity. Examples of suitable cross-linking (thermoset) systems are any single one or any combination of aliphatic or aromatic epoxy acrylates, urethane acrylates, polyester acrylates, polyether acrylates, saturated hydrocarbon acrylates, epoxides, epoxide-amine systems, epoxide-carboxylic acid combinations, oxetanes, vinyl ethers, vinyl derivatives, and thiol-ene systems. Suitable examples of elastomeric materials are polysiloxanes. Examples of suitable branched or linear polymeric systems are any single one or any copolymer or physical combination of polyacrylates, polyesters, polyethers, polypropylenes, polyethylenes, polybutadienes, polynorbornene, cyclic olefin copolymers, polyvinylidenefluoride, polyvinylidenechloride, polyvinylchloride, polytetrafluoroethylene, polychlorotrifluoroethylene, polyhexafluoropropylene.

The inorganic layer(s) may be any ceramic including but not limited to metal oxide, such as indium oxide ($In_2O_3$), tin oxide ($SnO_2$), indium tin oxide (ITO), a metal nitride, such as aluminium nitride (AlN), silicon nitride (SiN), a carbide, such as silicon carbide, a metal oxynitride, e.g. siliconoxynitride, or any other combination such as metal oxy carbides, metal carbonitrides, metal oxycarbonitrides. In case that the electronic device has an optical function it is relevant that at least one side (foundation or cover) is substantially transparent ceramic. Suitable materials therefore are for example silicon oxide ($SiO_2$), aluminum oxide ($Al_2O_3$), titanium oxide ($TiO_2$), indium oxide ($In_2O_3$), tin oxide ($SnO_2$), indium tin oxide (ITO, $In_2O_3+SnO_2$), (SiC), silicon oxynitride (SiON) and combinations thereof.

The inorganic layer(s) are in practice substantially thinner than the organic layers. The inorganic layers should have a thickness in the range of 10 to 1000 nm, preferably in the range of 100 to 300 nm, whereas the organic layers may have a thickness between 0.1-100 µm, preferably between 5 and 50 µm.

The total thickness of the barrier structure 20 is preferably at least 50 µm. At a thickness substantially smaller than 50 µm, e.g. 20 µm, the resulting encapsulated electronic device tends to damage to quickly. Preferably the total thickness is less than 500 µm. If the thickness is substantially more, e.g. 1 mm, the flexibility of the product is impaired.

FIG. 2A-2I shows a first exemplary embodiment of a method according to the invention.

According to this embodiment in step S1, shown in FIG. 2A a metal substrate 10 is provided, having a thickness in a range of 50 to 500 μm of a metal as specified above. The metal may be a sheet having a width of some tens of cm's and a length of some hundred meters to kilometers, so that it can be processed in a continuous process, e.g. a roll to roll process.

As shown in FIG. 2B, the metal layer 10 is provided with a transparent conductive layer 15. Various methods are available to apply the transparent conductive layer, however most preferred is to apply this layer by atmospheric pressure chemical vapor deposition (APCVD), as this is a fast and relatively cheap method. In the method according to the present invention this is enabled in that the metal substrate withstands the high processing temperatures required for APCVD.

In a next step S2, shown in FIG. 2C, a barrier structure 20 is applied at a free surface of this transparent conductive layer 15.

The inorganic layers of the barrier structure 20 may be applied by all kinds of physical vapour deposition methods such as thermal evaporation, e-beam evaporation, sputtering, magnetron sputtering, reactive sputtering, reactive evaporation, etc. and all kinds of chemical vapour deposition methods such as thermal chemical vapour deposition (CVD), photo assisted chemical vapour deposition (PACVD), plasma enhanced chemical vapour deposition (PECVD), etc.

The one or more organic layers of the barrier structure 20 may be applied by all kinds of coatings techniques, such spin coating, slot-die coating, kiss-coating, hot-melt coating, spray coating, etc. and all kinds of printing techniques, such as inkjet printing, gravure printing, flexographic printing, screen printing, rotary screen printing, etc.

The barrier structure 20 may serve as a second substrate that provides sufficient stability in itself without necessitating the presence of the metal substrate 10. If necessary an additional foil may be laminated at a free surface of the barrier structure 20.

For some electro-optic devices, such as some photovoltaic cells, a barrier structure is not necessary. In that case a simple organic substrate may be applied.

In a subsequent step shown in FIG. 2D, the metal substrate 10 is partially removed in a uniform way to a thickness in a range of 1 to 50 μm, depending on the case. Preferably partial removal takes place by etching. By way of example a copper substrate may be etched by etchants like FeCl3, nitric acid or sulphuric acid. By way of example an aluminium substrate may be etched by NaOH, KOH and mixtures of phosphoric acid and nitric acid.

In step S3, shown in FIGS. 2E and 2F an etched metal structure 12 is formed as the remaining part of the metal substrate. As shown in FIG. 2E, a patterned photoresist layer 14 is applied. The photoresist layer 14 is for example patterned by a positive or negative lithographic process. Alternatively an etch resistant lacquer layer may be applied according to a desired pattern with a printing process for example. In the following step the substrate is etched to create a desired electrically conductive pattern 12, for example a pattern of conductive lines.

In practice the etch process not only removes the metal in a depth direction but also laterally, so that the remaining photoresist layer or lacquer layer 14 extends on both sides of the ribs formed by the etched metal structure 12.

In a subsequent step S4, shown in FIG. 2G a functional structure 30 is applied. In the embodiment shown the functional structure 30 is a light-emitting structure comprising a PEDOT layer 32 and a LEP layer 34. In another embodiment, where the method is used to manufacture a photo-voltaic cell, the functional structure 30 may comprise a layer for converting photon radiation into an electric voltage. For that purpose a material like copper indium diselinide, cadmium telluride etc may be used. If the method is used to manufacture an electrochrome element, then again other materials may be used for the functional structure 30.

As shown in FIG. 2H a cathode layer 36 is applied at the functional structure 30. In the embodiment shown the cathode layer is a dual layer of Ba and Al. In a practical embodiment the cathode layer is applied by a chemical vapor deposition, for example by a PECVD process. Due to the fact that the patterned layer 14 extends over the ribs formed by the etched metal structure 12, it prevents that the vaporized cathode material touches the metal structure 12, and therewith prevents a short-circuit.

In a final step, shown in FIG. 2I, the structure formed in the previous steps is embedded in a barrier structure 40. Similar materials may be used for this structure 40 as were used for the barrier structure 20.

As mentioned before with reference to step S2, an additional foil 50 may be applied at the barrier structure 20. This results in the product shown in FIG. 2J.

For clarity it is not illustrated in these Figures how the electronic device is electrically connected to external conductors. By way of example this may be realized by punching respective holes, for example by laser drilling, through at least one of the barrier layers towards electrical connectors 12, 36 of the electronic device and filling these holes with a conductive material.

Figures 3, 3A:
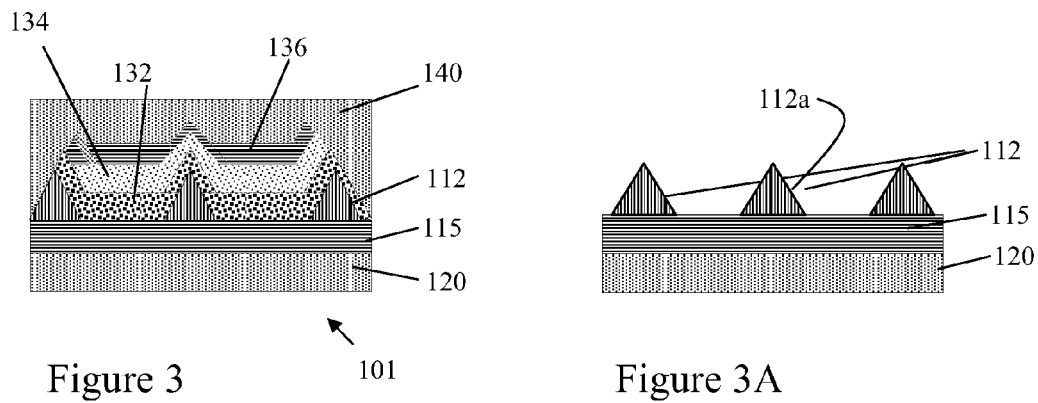
FIG. 3 shows a further embodiment of device according to the invention.
FIG. 3A shows an intermediate product in a method of manufacturing the device of FIG. 3, FIG. 4A-4D show steps of an alternative method.

In FIG. 3 parts corresponding to those in FIG. 2I have a reference number that is 100 higher. The device shown in FIG. 3 was manufactured according to an alternative method. In this device the functional structure 132, 134 and the electrode 136 cover the transparent electrically conductive layer 115 and the electrically conductive structure 112 blanket wise. The device shown in FIG. 3 can be obtained by a further etching of the electrically conductive structure 12 of the semi-finished product shown in FIG. 2F, until the electrically conductive structure 112 has inclined surfaces 112a that incline towards the layer at which they are applied, here the transparent electrically conductive layer 115. In subsequent steps the functional structure 132, 134, the cathode layer 136 and the barrier structure 140 can be deposited blanketwise upon the surface formed by the transparent electrically conductive layer 115 and the electrically conductive structure 112.

In the method illustrated with reference to FIGS. 2A to 2J, the metal substrate 10 was first homogeneously reduced in thickness, as shown in FIG. 2D, and subsequently patterned in step S3, shown in FIGS. 2E and 2F. It is alternatively possible to pattern the metal substrate first and subsequently remove an amount of the metal homogeneously. This is illustrated in FIG. 4A to FIG. 4D. Therein parts corresponding to those in FIG. 2I have reference numbers that are 200 higher.

Figure 4A:
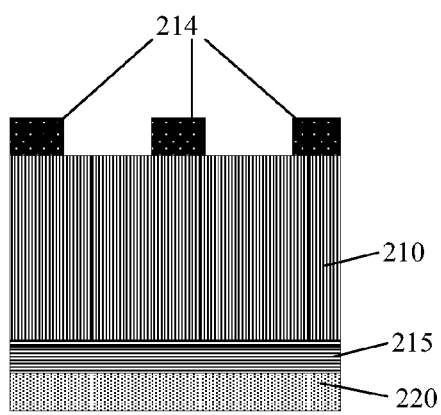
Figure 4B:
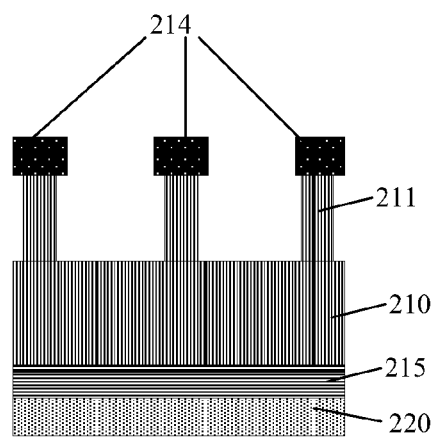
Figure 4C:
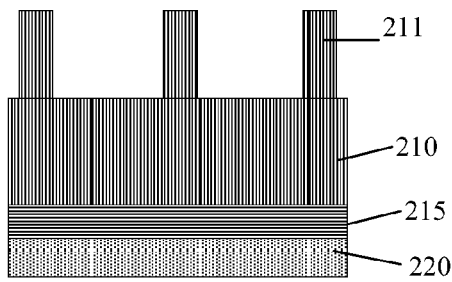
Figure 4D:
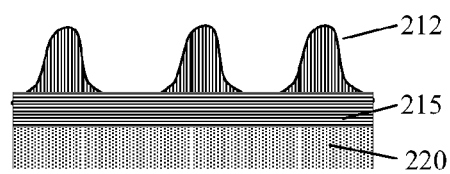

Starting from the semi-finished product of FIG. 2C, a patterned photoresist or lacquer layer is formed on the metal substrate 210, therewith obtaining the semifinished product shown in FIG. 4A. Subsequently the metal substrate 210 is selectively etched using the patterned photoresist or lacquer layer 214 resulting in the semi-finished product of FIG. 4B, wherein the metal substrate 210 has protruding portions 211. In a subsequent step the photoresist layer or lacquer layer 214 is removed as shown in FIG. 4C, and subsequently the metal substrate 210 of the semi-finished product of FIG. 4C is homogeneously etched having smoothly curved surface details as a result, as shown in FIG. 4D. This semi-finished product may now be further processed by the steps shown in en described with reference to FIGS. 2G to 2J, or FIG. 3, 3A, or by the steps described below with reference to FIG. 6E.

Figure 5A:
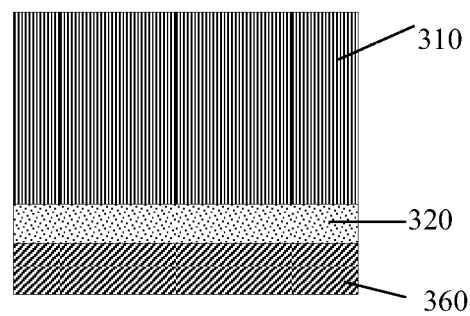
FIG. 5A-5B illustrate a further alternative method, Therein
Figure 5B:
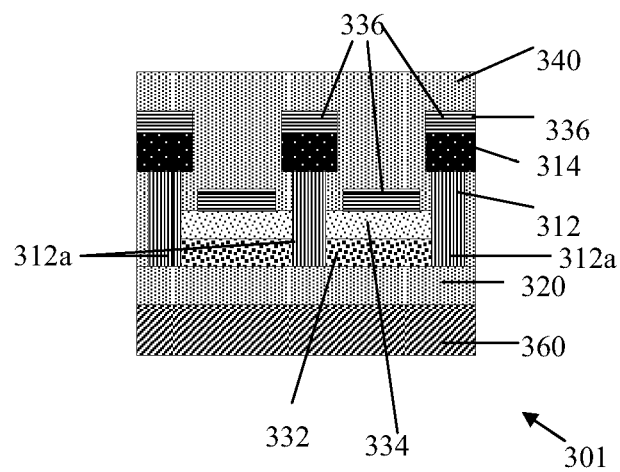

FIGS. 5A and 5B illustrate a further embodiment of a method according to the invention. Parts therein corresponding to those in FIGS. 2A-2J have a reference number that is 300 higher. In this embodiment a barrier structure 320 is directly applied at the metal substrate 310. A support substrate 360 can be applied, if necessary for mechanical strength. The support substrate is for example an organic layer, e.g. a polymer layer such as a PEN-layer or a PET-layer. The organic layer may be laminated at the metal substrate 310 with the barrier structure 320, resulting in the semi-finished product of FIG. 5A. The organic layer may be laminated using an adhesive. The support substrate 360 may be removed at a later stage if desired. No transparent inorganic conductive layer is applied. The lateral electrical conduction can be provided by high conductivity organic materials in layer 32. Since the distance between two subsequent shunt lines, formed by the structure 312 can be relatively short, state of the art organic conductors such as high conductivity PEDOT show sufficient conductivity for this purpose. The semi-finished product of FIG. 5A is then subsequently processed according to the steps described with reference to FIG. 2D to FIG. 2I, resulting in the electro-optic device according to FIG. 5B. Alternatively steps described with reference to FIGS. 4A to 4D may replace the steps descried with reference to FIG. 2D to FIG. 2F. In again another embodiment the steps described with reference to FIG. 3 are applied, starting from the semi-finished product of FIG. 2F or FIG. 4D.

Figure 6A:
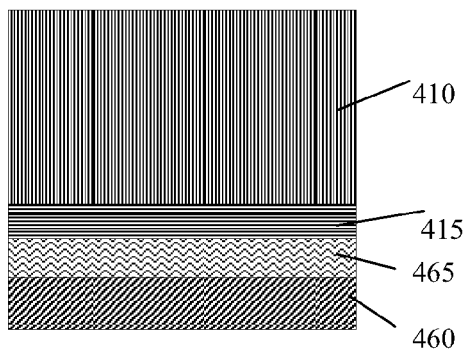
FIG. 6A-6E illustrates a still further alternative method, Therein
Figure 6B:
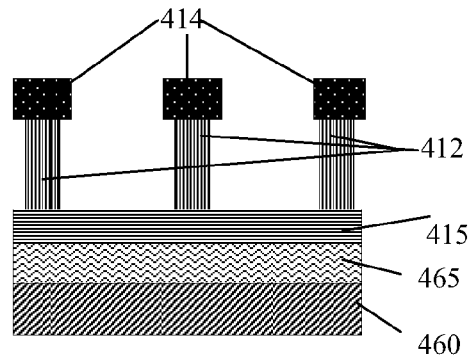
Figure 6C:
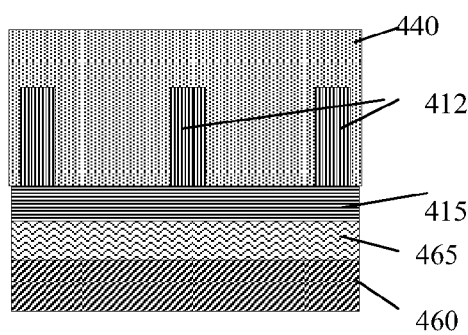
Figure 6D:
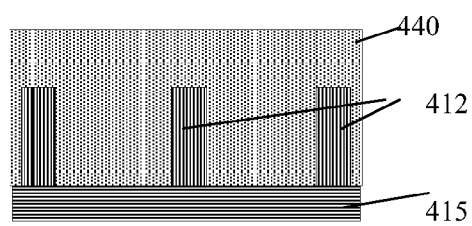

A still further embodiment of a method according to the invention is described with reference to FIGS. 6A-6E. Parts therein corresponding to those in FIGS. 2A-2J have a reference number that is 400 higher. Starting from the semi-finished product shown in FIG. 2B, a temporary carrier 460 is applied as the second substrate. The second substrate 460, for example a polymer foil, e.g. a PET or PEN-foil is adhered with a suitable adhesive layer 465 to a free surface of the transparent conductive layer 415, resulting in the semi-finished product shown in FIG. 6A. Polydimethylsiloxane PDMS has been proven useful as a material for the adhesive layer 465. This material provides for a sufficient adhesion for handling purposes, while it allows for an easy removal in a later stage. Alternatively an adhesive may be used for the layer 465 that can be weakened by a treatment, e.g. a heat treatment or a radiation treatment. Subsequently the metal substrate 410 is patterned in a way similar as described with reference to FIGS. 2D, 2E, 2F. In this way the semi-finished product of FIG. 6B is obtained. Alternatively, the steps described with reference to FIGS. 4A to 4D may be applied. Continuing with the intermediate result of FIG. 6B, a barrier structure 440 is applied that embeds the electrically conductive structure 412, as is shown in FIG. 6C. The barrier structure 440 and the structure 412 embedded therein, now form a third substrate that allows for a removal of the temporary substrate 460 and the adhesive layer 465, as shown in FIG. 6D. Continuing with the semi-finished product of FIG. 6D a functional structure 330 comprising a PEDOT-layer 432, a LEP-layer 434 and a cathode 436 are applied as a stack at the surface formed by the transparent conductive layer 415. Also here the layer 415 is optional. Its function may be fulfilled by an organic conductor instead, e.g. the layer 432. Finally, a barrier structure 420 is applied that encapsulates the stack.

This embodiment has the advantage that the electrically conductive structure 412 can have an arbitrary height, while the functional structure 430 can be deposited blanket wise. Blanket deposition is substantially faster and therewith cheaper than a patterned deposition. If desired the transparent conductive layer 415 may be omitted, so that the electrically conductive structure 412 is in direct contact with the layer 432 of the functional structure 430.

Figure 6E:
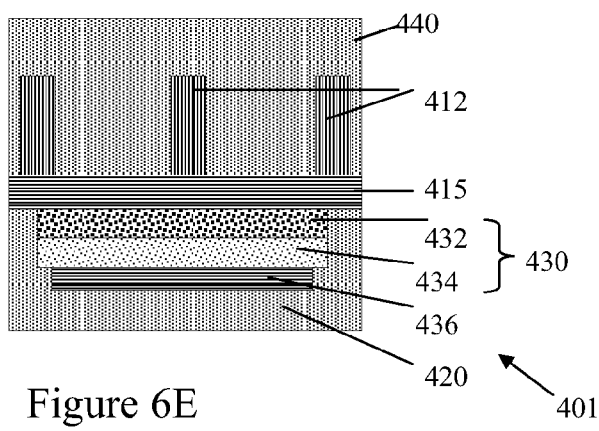

In FIG. 7A parts corresponding to those of FIG. 6E have a reference number that is 100 higher. FIG. 7 shows that instead of encapsulating the stack in a barrier structure 420, it is alternatively possible to shield the device at the side of the cathode 536 with a metal layer 570. The metal layer 570 is for example a foil of aluminium that is adhered with a conductive adherent to the cathode 536. Instead of aluminium also other metals are suitable, for example such as are also suitable for the substrate. In addition side faces of the device are provided with a sealant 580. Possible sealants comprise epoxies, acrylates, Norland 68 UV curables, thermally curable adhesives, pressure sensitive adhesives, such as thermosets and thermoplasts or room temperature vulcanized (RTV) adhesives, for instance. The sealant 580 generally comprises any material having a low permeability and providing adhesion. A first external contact 590 may be applied directly to the metal layer 570. A second external contact 591 may be connected via an intermediate conductor 592 to the electrically conductive structure 512. The intermediate conductor 592 is formed for example by drilling a hole, preferably by laser drilling, in the barrier structure 540, and filling the hole with a conductive adhesive. In an analogous manner electrical connections may be made between an external contact and the electrically conductive structure in other embodiments.

In FIG. 7B parts corresponding to those of FIG. 7A have a reference number that is 100 higher. FIG. 7B shows an alternative way of shielding the side-faces of the device 601. In this case the side-faces are sealed by flexible edge-seals 685 that are attached to the side faces of the device using a sealant 680. The flexible edge-seals 685 may be formed of a metal foil, e.g. a copper or an aluminium foil. A sealant 680 may be used as described with reference to FIG. 7A.

For many practical purposes it is sufficient that the etched metal structure is electrically coupled to only one of the electrodes. For example with application in organic light emitting diodes, the materials for the cathode, such as Ba/Al and LiF have a relative good conductivity, so that it is only necessary to support the anode layer. Nevertheless for even larger areas it may be necessary to support both electrodes.

Figure 8:
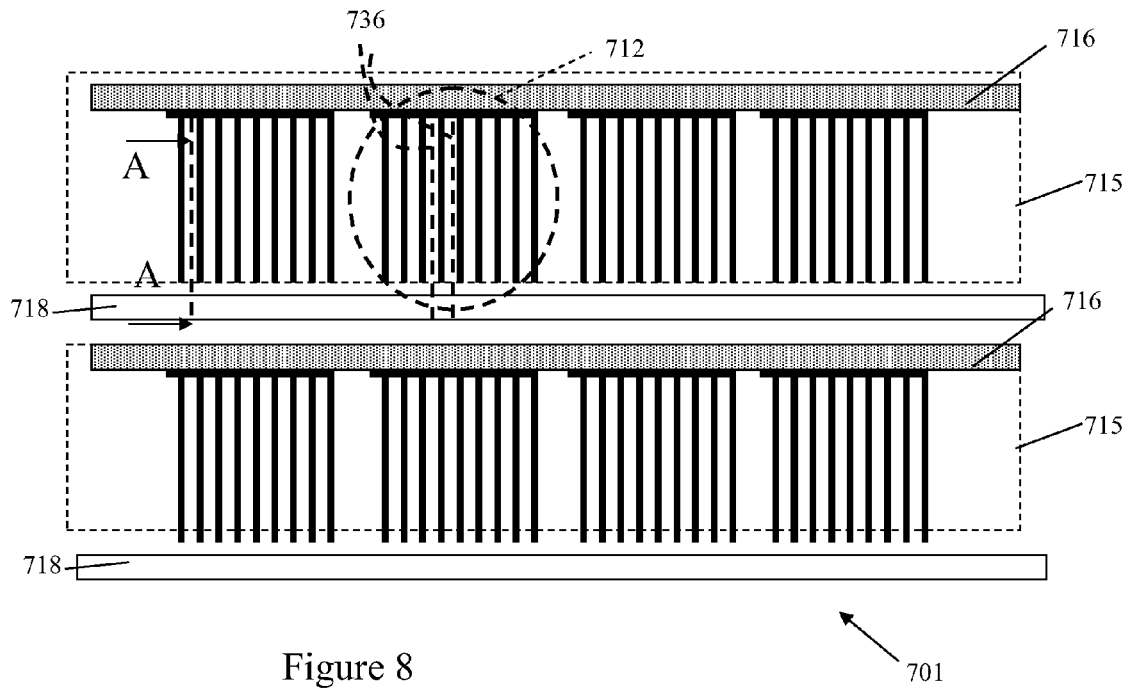
FIG. 8 illustrates an aspect of a still further embodiment of the invention.
Figure 8A:
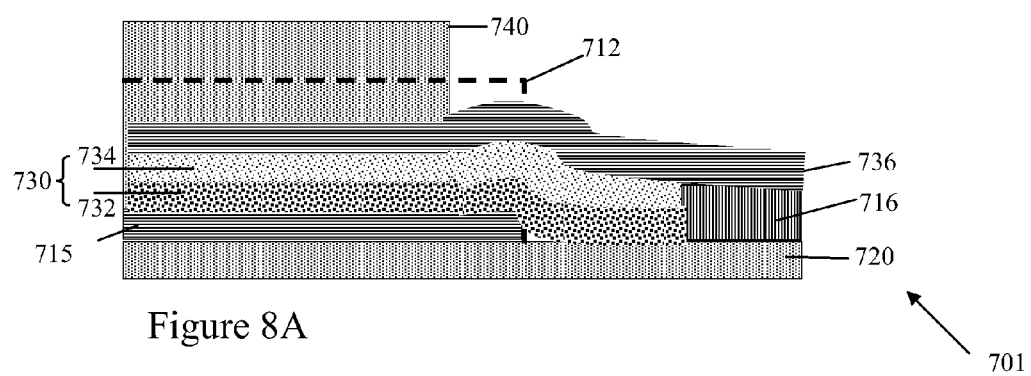
FIG. 8A shows a cross-section of FIG. 8 according to A-A in FIG. 8.

FIG. 8 shows in a top view an example how this can be realized without using vias. FIG. 8A clarifies this further with a cross-section according to A-A in FIG. 8. In the embodiment shown in FIGS. 8 and 8A, parts corresponding to FIG. 2I have a reference that is 700 higher. The device shown in FIG. 8 comprises a plurality of etched metal structures as described with reference to 2I. Apart from the etched metal structures 712 main conducting lines 716 are present, that are also derived as the remainder of a metal foil after an etching process. The main conducting lines form a unity with the etched metal structures 712. Further main conductors 718 are present that are also derived as the remainder of a metal foil after an etching process. The further main conductors 718 are applied in zones where the transparent conductive layer 715 is absent, and the cathode layer 736 extends over these further main conductors 718, so that they are electrically connected to the further main conductors.

It is noted that getter materials may be applied in various parts of the device. For example getter material may be enclosed with the functional structure. Alternatively getter materials may be present in an organic layer of a barrier structure. Various desiccant materials such as molecular sieves (or zeolites), alkaline earth metal oxides, metal oxides, sulfates, chlorides, bromides may be selected as the getter. Zeolites are particularly suitable. Zeolites are materials that absorb moisture by physical absorption and may be naturally or synthetically derived, both are suitable. Natural zeolites are hydrated silicates of aluminum and either sodium or calcium or both, of the type Na2O, Al2O3, xH2O, and xSiO2. Synthetic zeolites are made either by a gel process or a clay process, which forms a matrix to which the zeolite is added. Well known zeolites include chabazite (also referred to as zeolite D), clinoptilolite, erionite, faujasite (also referred to as zeolite X and zeolite Y), ferrierite, mordenite, zeolite A, and zeolite P. For example, type 3A, 4A and 13X zeolites all have the ability to adsorb water molecules. Such zeolites comprise Na2O, Al2O3 and SiO2. Certain adsorbent getters can adsorb gaseous contaminants in addition to moisture, such as gaseous H2 and O2.

The electro optic device may further be provided with a layer provided with scattering particles having a relatively high refractive index in comparison to the relatively low reflective index of the layer to improve light output. Such a layer may be applied for example at a free surface of the device.

In the claims the word "comprising" does not exclude other elements or steps, and the indefinite article "a" or "an" does not exclude a plurality. A single component or other unit may fulfil the functions of several items recited in the claims. The mere fact that certain measures are recited in mutually different claims does not indicate that a combination of these measures cannot be used to advantage. Any reference signs in the claims should not be construed as limiting the scope.

What is claimed is:

1. Electro-optic device, comprising:
    a substrate that supports a first electrode and a second electrode;
    a functional structure comprising at least one functional layer, that is electrically coupled to said first and second electrodes; and
    an etched metal structure being electrically coupled to at least one of the electrodes, said at least one of the electrodes being formed as a layer, wherein a surface of the etched metal structure directly contacts the layer, wherein said layer is a transparent conductive electrode that is attached directly to ribs of the etched metal structure.

2. Electro-optic device according to claim 1, wherein the etched metal structure is embedded in a barrier structure.

3. Electro-optic device according to claim 2, wherein a barrier structure is applied at a surface of the transparent conductive electrode opposite a surface of said transparent conductive electrode at which it is attached to the ribs of the etched metal structure.

4. Electro-optic device according to claim 1, wherein ribs of the etched metal structure are provided with a remaining photo-resist or lacquer layer at a side opposite the transparent electrically conductive layer, said remaining photo-resist or layer extending on both sides of the ribs.

5. Electro-optic device according to claim 1, wherein the functional structure and the other one of the first and the second electrodes blanketwise cover the transparent electrically conductive electrode and the etched metal structure.

6. Electro-optic device according to claim 1, wherein in a barrier structure is applied at a surface of the transparent conductive electrode opposite a surface of said transparent conductive electrode at which it is attached to the ribs of the etched metal structure.

7. Method of manufacturing an electro-optic device comprising the following subsequent steps of:
    providing a first, metal substrate;
    providing a second substrate; and
    selectively etching the metal substrate to form an etched metal structure,
    wherein the first metal substrate is provided with a transparent electrically conductive layer before the step of selectively etching the metal substrate and wherein the first metal substrate is provided with a transparent electrically conductive layer before the step of providing a second substrate and that the transparent electrically conductive layer is applied by an APCVD process.

8. Method of manufacturing an electro-optic device comprising the following subsequent steps of:
    providing a first, metal substrate;
    providing a second substrate;
    selectively etching the metal substrate to form an etched metal structure; and
    depositing a functional structure,
    wherein the step of selectively etching the metal substrate is proceeded with a step of homogeneously reducing a thickness of the metal substrate.

9. Method according to claim 8, characterized in that a thickness of the metal substrate is homogeneously reduced with at least a factor 2.

10. Method according to claim 8, wherein the functional structure is deposited blanketwise over the etched metal structure.

11. Method of manufacturing an electro-optic device comprising the following subsequent steps of:
    providing a first, metal substrate;
    providing a second substrate;
    selectively etching the metal substrate to form an etched metal structure; and
    depositing a functional structure,
    wherein the step of selectively etching the metal substrate is succeeded with a step of homogeneously reducing a thickness of the metal substrate.

12. Method according to claim 11, characterized in that a thickness of the metal substrate is homogeneously reduced with at least a factor 2.

13. Method according to claim 11, wherein the functional structure is deposited blanketwise over the etched metal structure.

14. Method of manufacturing an electro-optic device comprising the following subsequent steps of:
    providing a first, metal substrate;
    providing a second substrate;
    selectively etching the metal substrate to form an etched metal structure; and
    depositing a functional structure,
    wherein the second substrate is removed after the etched metal structure is embedded into a third substrate, and wherein the functional structure is applied at the place of the second substrate.

15. Method of manufacturing an electro-optic device comprising the following subsequent steps of:
    providing a first, metal substrate;
    providing a second substrate;
    selectively etching the metal substrate to form an etched metal structure; and
    depositing a functional structure,
    wherein the second substrate is directly applied at the first, metal substrate.

* * * * *